(12) United States Patent
Erden et al.

(10) Patent No.: US 11,223,447 B1
(45) Date of Patent: Jan. 11, 2022

(54) MULTIPLE DETECTOR DATA CHANNEL AND DATA DETECTION UTILIZING DIFFERENT COST FUNCTIONS

(71) Applicant: Seagate Technology LLC, Fremont, CA (US)

(72) Inventors: Mehmet Fatih Erden, Fremont, CA (US); Walter R. Eppler, Fremont, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/219,444

(22) Filed: Mar. 31, 2021

(51) Int. Cl.
 *H04L 1/00* (2006.01)
 *H04L 25/03* (2006.01)
(52) U.S. Cl.
 CPC .......... *H04L 1/0054* (2013.01); *H04L 1/0059* (2013.01); *H04L 25/03057* (2013.01)
(58) Field of Classification Search
 CPC ................. H04L 1/0054; H04L 1/0059; H04L 25/03057
 See application file for complete search history.

(56) References Cited

U.S. PATENT DOCUMENTS

| 869,488 | A | 10/1907 | Hanffstengel |
| 6,708,308 | B2 | 3/2004 | De et al. |
| 7,061,977 | B2 * | 6/2006 | Martin ................. H04N 21/426 375/233 |
| 7,502,982 | B2 | 3/2009 | Silvus et al. |
| 7,738,201 | B2 | 6/2010 | Jin et al. |
| 7,744,798 | B2 | 6/2010 | Ishizawa et al. |
| 7,788,572 | B1 | 8/2010 | Ulriksson |
| 7,843,847 | B2 | 11/2010 | Quigley et al. |
| 8,413,029 | B2 | 4/2013 | Rauschmayer et al. |
| 8,467,466 | B2 | 6/2013 | Bjerke et al. |
| 8,489,971 | B1 | 7/2013 | Chan et al. |
| 8,542,724 | B1 * | 9/2013 | Blackmon .............. H04B 11/00 375/229 |
| 8,873,612 | B1 | 10/2014 | Eliaz |
| 9,166,834 | B2 | 10/2015 | Eliaz |
| 9,191,256 | B2 | 11/2015 | Vojcic et al. |
| 9,397,698 | B1 | 7/2016 | Burd et al. |
| 9,438,276 | B2 | 9/2016 | Varnica et al. |
| 10,382,166 | B1 | 8/2019 | Ashe et al. |
| 10,608,808 | B1 * | 3/2020 | Bellorado ......... H04L 25/03057 |
| 2004/0001538 | A1 * | 1/2004 | Garrett .............. H04L 25/03267 375/229 |

(Continued)

*Primary Examiner* — Freshteh N Aghdam
(74) *Attorney, Agent, or Firm* — Kirk A. Cesari

(57) ABSTRACT

Systems and methods are disclosed for a multiple detector data channel and data detection utilizing different cost functions. For example, a digital data channel system can have multiple data detectors where each data detector implements a distinct cost function for detecting data. A cost function analyzer can then selectively choose decisions from the multiple data detectors to generate a data sequence. In some examples, a dual detector system may have one detector implement a Soft-Output Viterbi Algorithm (SOVA) cost function and another detector implement a peak detection algorithm. Further, in some embodiments, the cost function analyzer can implement multiple selection criteria to determine which decisions to include in a data sequence from the multiple data detectors.

20 Claims, 3 Drawing Sheets

(56) References Cited

U.S. PATENT DOCUMENTS

| | | | |
|---|---|---|---|
| 2004/0013190 A1* | 1/2004 | Jayaraman | H04L 25/03057 375/233 |
| 2015/0124912 A1* | 5/2015 | Eliaz | H04L 25/03305 375/341 |
| 2015/0131710 A1* | 5/2015 | Eliaz | H04L 7/0087 375/233 |
| 2017/0311331 A1* | 10/2017 | Chae | H04W 16/28 |

* cited by examiner

MULTIPLE DETECTOR DATA CHANNEL AND DATA DETECTION UTILIZING DIFFERENT COST FUNCTIONS

SUMMARY

In certain embodiments, an apparatus may comprise a data channel including a first detector circuit configured to receive a signal representing a digital data signal and detect first decisions within the digital data signal based on a first cost function. The data channel may also include a second detector circuit configured to also receive the signal representing the digital data signal and detect second decisions within the digital data signal based on a second cost function; a cost function analyzer circuit configured to selectively provide the first decisions or the second decisions as a data sequence based on a comparison of the first decisions and the second decisions; and a decoder circuit configured to receive the data sequence, decode the data sequence, and provide a data output of the data channel.

In certain embodiments, a method may include receiving, at a data channel, an encoded digital data signal; determining, via a first detector, first decisions corresponding to data within the digital data signal based on a first cost function; determining, via a second detector, second decisions corresponding to the data within the digital data signal based on a second cost function distinct from the first cost function; determining a data sequence based on the first decisions and the second decisions; providing the data sequence to a decoder; generating, via the decoder, decoded data based on the decoder; and providing the decoded data as an output of the data channel.

In certain embodiments, a system can include a data channel having a first detector configured to receive a signal, determine first decisions and first log likelihood ratios (LLRs) corresponding to digital samples of the signal based on a first cost function; a second detector configured to also receive the signal, determine second decisions and second LLRs corresponding to the digital samples of the signal based on a second cost function; a cost function analyzer configured to analyze the first decisions, the first LLRs, the second decisions, and the second LLRs to determine a data sequence representing the signal; and a decoder configured to decode the data sequence and provide a data output of the data channel.

DETAILED DESCRIPTION

Figure 1:
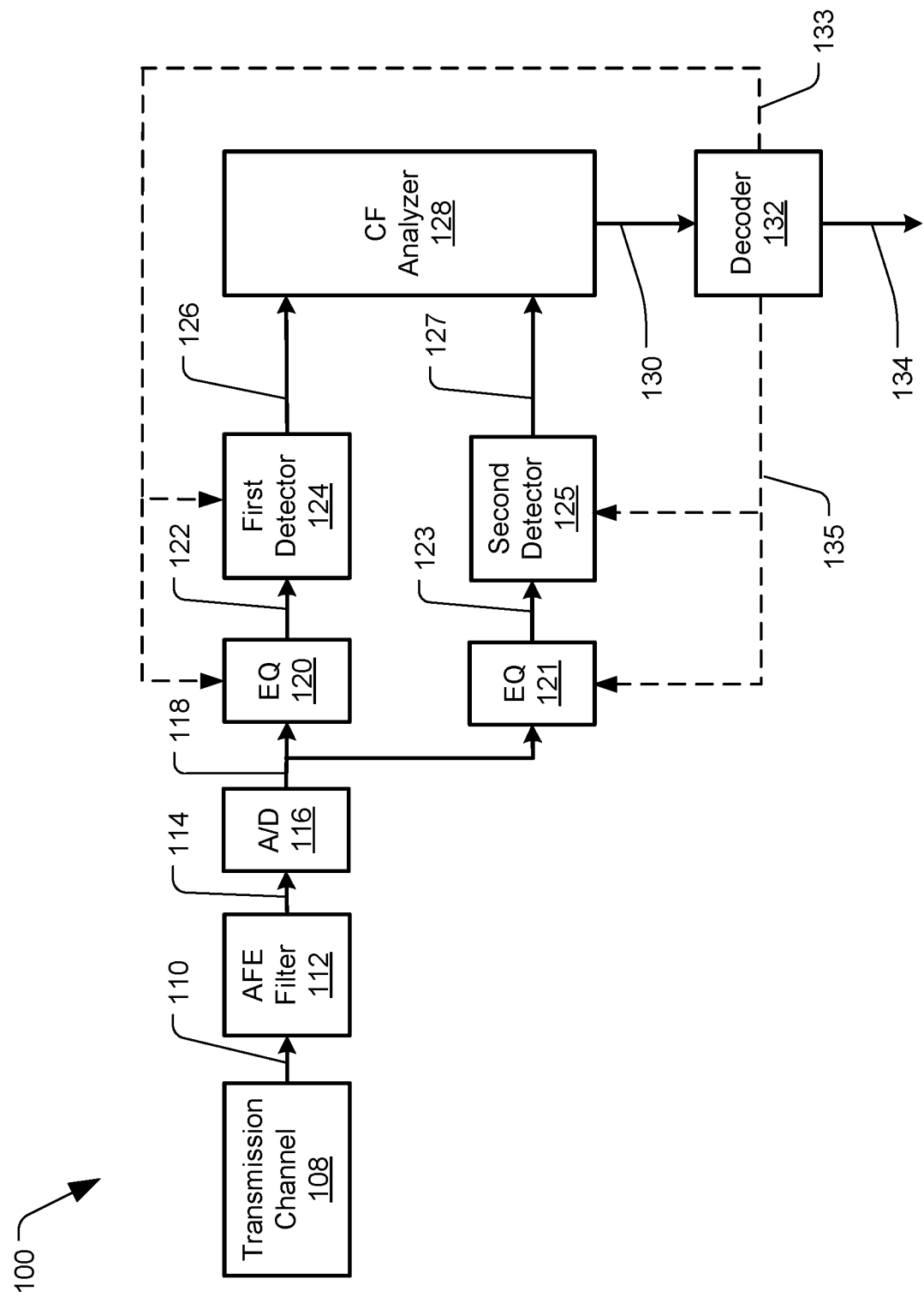
FIG. 1 is a diagram of a multidetector data channel utilizing different cost functions, in accordance with certain embodiments of the present disclosure.

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, system-on-chip (SoC), and other hardware devices can likewise be constructed to implement the circuits, functions, processes, and methods described herein. Methods and functions may be performed by modules or engines, both of which may include one or more physical components of a computing device (e.g., logic, circuits, processors, controllers, etc.) configured to perform a particular task or job, or may include instructions that, when executed, can cause a processor to perform a particular task or job, or may be any combination thereof. Further, the methods described herein may be implemented as a computer readable storage medium or memory device including instructions that, when executed, cause a processor to perform the methods.

While the discussion herein is provided with respect to magnetic data storage, one skilled in the art will recognize that the technologies and solutions disclosed are applicable to any data channel that needs to correct for errors or noise within the received signal.

For example, in a magnetic recording data channel, the noise sources of the magnetic recording data channel can be characterized by various metrics, such as, electronic Signal-to-Noise Ratio (eSNR), which can define the amount of noise independent of the data. One source of eSNR can be noise caused by the reader on the magnetic head. Another noise source, characterized by media Signal-to-Noise Ratio (mSNR), in a magnetic recording data channel can be jitter noise, which can be a measure of data dependent noise and observed at magnetic transitions of the data storage medium. In some situations, jitter noise may be the dominant noise source in magnetic recording.

Thus, due to the multiple sources of noise that may be present in a received data signal, a data channel can have difficulty using a single detector to correct for multiple errors caused by different types of noise. Thus, a solution is provided herein where a data channel can include multiple detection paths to compensate for the multiple sources of noise. Further, the multiple detection paths can implement different detectors using different cost functions. Examples discussed herein will be primarily discussed with respect to a data channel having two data detection paths; however, this disclosure is not limited to such and is extendable to any number of detection paths, the number of which are only limited by design cost and integrated circuit manufacturing capabilities.

Referring to FIG. 1, a block diagram of a multidetector data channel utilizing different cost functions is shown and is generally designated 100. A data channel can include an analog-front-end ("AFE") 112 that may include a filter, an analog-to-digital converter ("A/D") 116, a first equalizer ("EQ") 120, a second equalizer 121, a first detector 124, a second detector 125, a cost function ("CF") analyzer 128, and a decoder 132. Each of the AFE 112, A/D 116, EQ 120, EQ 121, first detector 124, second detector 125, CF analyzer 128, and decoder 132 may be implemented as a separate circuit, a system on chip (SOC), firmware, a processor(s), discrete circuit, or other system not listed, or any combination thereof. EQ 120 and EQ 121 may be independent, separate circuits or modules from each other, though they may be incorporated into a same integrated circuit such as an SoC. Further, the first detector 124 and the second detector 125 may be independent, separate circuits or modules from each other, though they may be incorporated into a same integrated circuit such as an SoC.

The AFE 112 may receive a continuous-time input signal 110 from a transmission channel 108, such as a read signal generated by a read element of a magnetic head as it reads data from a magnetic data storage medium, and the AFE 108 may perform processing such as analog filtering and applying a gain to produce an output of an adjusted continuous time signal 114. The A/D 116 may sample the adjusted continuous-time signal 114 at regular intervals and may quantize the signal to produce a digitized sequence of samples 118, which may be provided to both the first EQ 120 and the second EQ 121.

The first EQ 120 may receive the digitized sequence of samples 118 and generate a first equalized sample sequence 122 that is provided to the first detector 124, which may operate to determine (or estimate) decisions and a data sequence 126 of bit values corresponding to the signal 114 based on a first detection method utilizing the equalized sample sequence 118 and the parameters of the first detector 124. The data sequence 126 may be representative of the probability that each bit is a zero or one. The values 126 may be represented as logs of the ratios of these probabilities and may be referred to as log likelihood ratios or LLRs. Thus, the first detector 124 may generate LLR values based on a first detection method. In some embodiments, the first detector 124 may implement a first detection method that is based on a first cost function, such as a Soft-Output Viterbi Algorithm (SOVA) with Data Dependent Noise Prediction (DDNP), which is an example of a detection method based on sequence detection in the time domain.

The second EQ 121 may receive the digitized sequence of samples 118 and generate a second equalized sample sequence 123 that is provided to the second detector 125, which may operate to determine (or estimate) decisions and a data sequence 127 of bit values corresponding to the signal 114 based on a second detection method utilizing the equalized sample sequence 118 and the parameters of the second detector 125. The data sequence 127 may be representative of the probability that each bit is a zero or one. The values 127 may be represented as logs of the ratios of these probabilities and may be referred to as log likelihood ratios or LLRs. Thus, the second detector 125 may generate estimates of the bit values or LLRs values based on a second detection method that is different than the first detection method. In some embodiments, the second detector 125 may employ a second detection method that is based on a second cost function that is distinct from the first cost function the first detection method is based on.

The CF analyzer 128 can receive a first set of decisions (including estimated bit values and LLRs) from the first detector 124 and a second set of decisions (which may include only estimated bit values or estimated bit values and LLRs) from the second detector 125, and other sets of LLRs from further detectors, and select detector decisions to represent the received signal 114 as the generated data sequence 130, which can be passed to the decoder 132. As discussed herein, the CF analyzer 128 may be implemented as any combination of logic circuit, discrete circuit, processor, firmware, or other hardware or software that can accomplish the functions and processes described herein.

In some embodiments, the CF analyzer 128 can determine which detected data sequence to pass to the decoder 132 based on analyzing one or more sets, or subsets, of decisions or LLRs from multiple detectors. For example, the CF analyzer 128 can receive a first set of LLRs and a first set of detector decisions, such as from the first detector 124 and determine if the first set of detector decisions, or a subset thereof, are acceptable based on the corresponding LLR values. If they are not acceptable, the CF analyzer 128 can compare unacceptable first detector decisions with the corresponding second detector decisions from the second detector 125 to determine if they match. When the first detector decision and the second detector decisions match, the CF analyzer 128 can utilize that decision in the data sequence. The CF analyzer 128 can pass the decisions that match without changing them, and can selectively modify any decisions that don't match based on one or more predefined rules (for example, flip the sign of the LLR, erase the LLR to zero, select a majority decision, or reduce the magnitude of the LLR).

In another example, the CF analyzer 128 can selectively analyze detector decisions based on a corresponding LLR value of each detector decision. This can be accomplished by selecting detector decisions that have a low value for the absolute value of their corresponding LLR, which can be implemented by comparing the absolute value of their corresponding LLR to a threshold value. The selected detector decisions can then be compared to the second detector decisions. When the selected detector decisions match the second detector decisions, the CF analyzer 128 can accept such detector decisions and provide them as the generated data sequence 130.

When the selected detector decisions do not match the second detector decisions, the CF analyzer 128 can implement one or more alternative selection methods. A first alternative selection method can include accepting, on a bit-by-bit basis, decisions that do not match the second detector decisions and instead selecting a corresponding majority decision (e.g., a decision determined by the majority of the detectors involved; such as, if there are three detectors and two of them decide the bit value as 1 and the other determines it as −1, the majority decision rule can set the bit value as 1) of a second detection path (e.g., EQ 121 and second detector 125), or of multiple other detection paths, instead of the decision of the first detection path (e.g., EQ 120 and second detector 124). The selected majority decisions from the second or other detection paths can be combined with the non-selected detector decisions as the generated data sequence 130. This first alternative method can be implemented as an on-the-fly mode that can operate while the data channel is selecting decisions from the multiple data paths without the need for re-running a data detection path.

A second alternative selection method can include, on a bit-by-bit basis, erasing a selected decision (e.g., assigning its corresponding LLR value to 0) or modifying its LLR value (e.g., by reducing its absolute value while keeping its sign) and then sending data sequence including the erased or modified decision to an ECC decoder, such as decoder 132, to attempt to recover a correct value of such erased bits. When the ECC decoder can recover the correct values of the corresponding erased decisions, such recovered decisions can be provided as an output of the data channel. This second alternative method can be implemented as an on-the-fly mode that can operate while the data channel is selecting decisions from the multiple data paths without the need for re-running a data detection path.

A third alternative selection method can include identifying different parameter sets for a detector of a specific detection path (e.g., the second detection path including the EQ 121 and second detector 125). The parameter sets can utilize feedback circuits 133 or 135 (which may include programmable buffer(s), memory(ies), or logic (e.g., field programmable gate array(s) (FPGA))) to adjust adaptive parameters used to detect decisions, by either adjusting settings of the equalizer, the detector, or both. For example, the adaptive parameters may be coefficients or taps of filter circuits. Once a selected data path has been reconfigured with the new parameters, the data path can reprocess the sampled signal 118 and arrive at new decisions with new corresponding LLR values. In some embodiments, the third alternative selection method can then analyze the new decisions and the new corresponding LLR values utilizing one or more of the decision selection methods. This third alternative method can be implemented as an error recovery mode, which may take one or more additional iterations of detecting decisions via a selected data path.

Once the CF Analyzer 128 has constructed the generated data sequence 130, it may be passed to the decoder 132 which may utilize error correcting code ("ECC") to correct errors in the generated data sequence 130 to generate decoded data 134. The decoder 132 may generate the decoded data 134, or extrinsic information which may be representative of the probability that each bit is a zero or one, based on a structure of a utilized ECC. In some implementations, the extrinsic information may be returned to either or both of the detectors via feedback 133 or feedback 135 (e.g. for use as part in an iterative decoding process being performed by a detector, CF analyzer, and decoder). The decoded data 134 may then be provided to a processor or computing device.

In some embodiments, a first detection path (e.g., EQ 120 and second detector 124) can include a pattern-dependent noise-predictive (PDNP) SOVA detector. A second detection path (e.g., EQ 121 and second detector 125) can include peak detection after Multi-Input-Multi-Output (MIMO) Equalizers at various (level 1 and level 2) wavelet transform domains. More details of such type of detection path can be found in U.S. Provisional Patent Application 63/168,788, entitled "Transform Domain Analytics Based Low Cost Detection", the contents of which is hereby incorporated by reference in its entirety. Thus, the cost function of the second detection path is different than the first detection path's PDNP SOVA detector.

Figure 2:
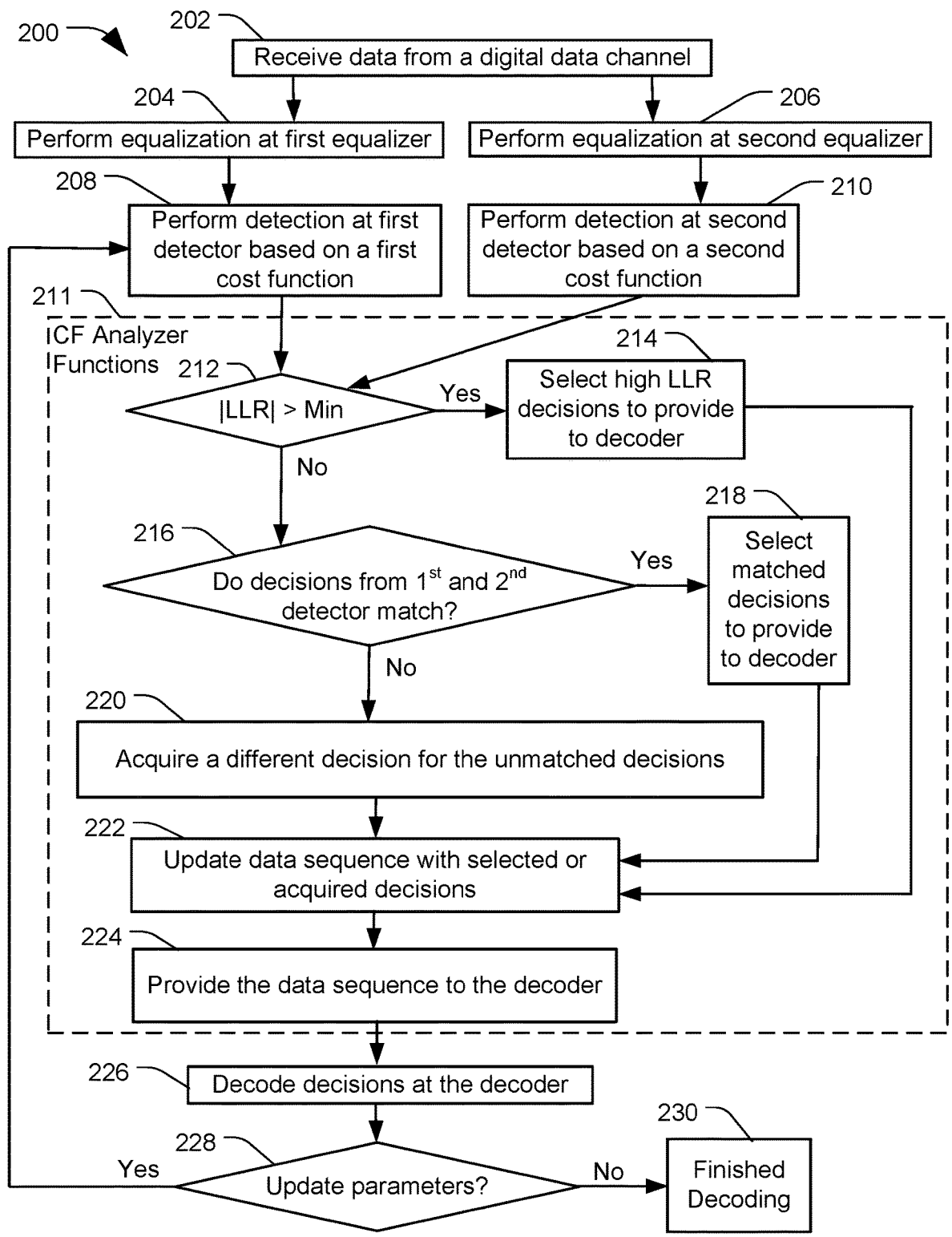
FIG. 2 is a flowchart of a method of data detection utilizing different cost functions, in accordance with certain embodiments of the present disclosure.

Referring to FIG. 2, a flowchart of a method of data detection utilizing different cost functions, in accordance with certain embodiments of the present disclosure, is shown and generally designated 200. The method 200 can be implemented by systems 100 or 300 as disclosed herein. The method 200 may include receiving digital samples of a data signal, such as sampled signal 118, at 202. The digital samples may be received at one or more equalizers, such as equalizers 120 and 121. A first equalizer can perform an equalization process, at 204, to generate a first equalized sample sequence and a second equalizer can perform an equalization process, at 206, to generate a second equalized sample sequence.

A first detector, such as detector 124, can receive the first equalized sample sequence and perform a first detection process based on a first cost function, at 208, to generate first decisions. In parallel, which in some examples may be done simultaneously or near simultaneously, a second detector, such as detector 125, can receive the second equalized sample sequence and perform a second detection process based on a second cost function, at 210, to generate second decisions. In some examples, the second cost function may be a cost function that generates only hard decisions for each bit and does not generate a corresponding LLR for each bit; however, in other embodiments, the second cost function could also be implemented as a cost function that generates LLRs for each second decision.

Once the first decisions and second decisions have been generated, they may be passed to a cost function analyzer, such as cost function analyzer 128, which may be a combination of a buffer and a logic circuit, to perform cost function analysis functions 209 that can implement multiple selection criteria to select bit decisions based on two or more cost functions. The cost function analyzer processes 209 can include a first evaluation criteria that can determine if the first decisions provided by the first detector meet a first criteria, at 212. In some embodiments, the first criteria may be a minimum LLR value; for example, the first decisions can have an LLR value associated with each bit and the cost function analyzer may determine whether an absolute value of each bit's LLR is greater than a minimum threshold ("Min") (e.g., which may be pre-determined and set when designing the system). When the decisions from the first detector meet the first criteria, such as when a bit's associated LLR value exceeds the threshold, the method 200 may select to utilize the bit decisions corresponding to such LLR values, at 214. In some examples, the second decisions may not have LLR values associated with them and do not need to be evaluated for the first criteria, at 212. However, in embodiments where the second decisions do have LLR values associated with each bit, a cost function analyzer may evaluate the LLR values of the second decisions to determine if they are greater than the minimum threshold, at 212, and can select to utilize such bit decisions, at 214.

When the decisions from the first detector do not meet the first criteria, at 212, the method 200 may selectively update or choose decisions using a second criteria, at 216. In some embodiments, the second criteria can be a match between the first decisions and the second decisions. For example, the second evaluation criteria can determine, on a bit-by-bit basis or a sector-by-sector basis, if the first decisions from the first detector match the second decisions from the second detector. When the decisions match, the method 200 may select to utilize the decision(s) associated with the matched bit(s) or sector(s) to provide to the decoder, at 218.

When the method 200 determines not to provide the decisions from the second evaluation criteria, at 216, the method 200 can implement a third process for determining or selecting a decision, at 220. In some embodiments, the third process may be implemented to acquire a different decision any decision that was not determined to be acceptable by the first criteria, at 212, and not acceptable by the second criteria, at 220, where the third process can be implemented by various methods.

For example, the third process may select, as the different decision, a majority decision determined by a majority of the detectors involved in determining either the first decisions or the second decisions when at least one of the first detector or second detector was a multiple-detector configuration that would allow the process 200 to determine a majority (e.g., a decision determined by the majority of the detectors involved; such as, if there are three detectors and two of them decide the bit value as 1 and the other determines it as −1, the majority decision rule can set the bit value as 1).

In further embodiments, the third process may generate the different decision by erasing the first decision(s) that do not match the second decision(s), such as by setting LLR values of the first decisions to zero while keeping the bit decision of the first decision (e.g., a decision of −0.3 would become −0.0 and a decision of 0.2 would become 0.0). Combinations and variations of these third processes can also be implemented.

Once a different decision is acquired, at 220, the method 200 may then update the data sequence with the different decision, at 222. Each of the selected or acquired decisions, such as at 214, 218, and 220, can be combined together (e.g., by using the first decisions as a base in the buffer and making updates to the first decisions as the second criteria and third criteria determine) to generate an updated data sequence, at 222, to provide to the decoder, at 224.

The decoder, such as decoder 132, can perform decoding operations to decode the decision of the data sequence, at 226. Based on the success of the decoding operations, the decoder may implement a parameter update, at 228, which can update parameter sets of one or more of the detectors used to detect decisions, such as by utilizing feedback loops 133 or 135. The parameter updates may adjust settings of the equalizer(s), the settings of detector(s), or any combination thereof. For example, the adaptive parameters may be coefficients or taps of filter circuits that can be adjusted in a detector circuit, such as first detector 124. Once a selected data path has been reconfigured with the new parameters, the data path can reprocess the sampled signal and arrive at new decisions with new corresponding LLR values, which the method 200 can then process. The method 200 can selectively process the first criteria, the second criteria, the third process, or any combination thereof with the new decisions from an updated parameter set. When a parameter update is not selected, the method 200 can end the decoding process, at 230. Ending the decoding process may include providing the detected bits, an error message, or a combination thereof to a requesting computing device (e.g., a processor or interface circuit).

Figure 3:
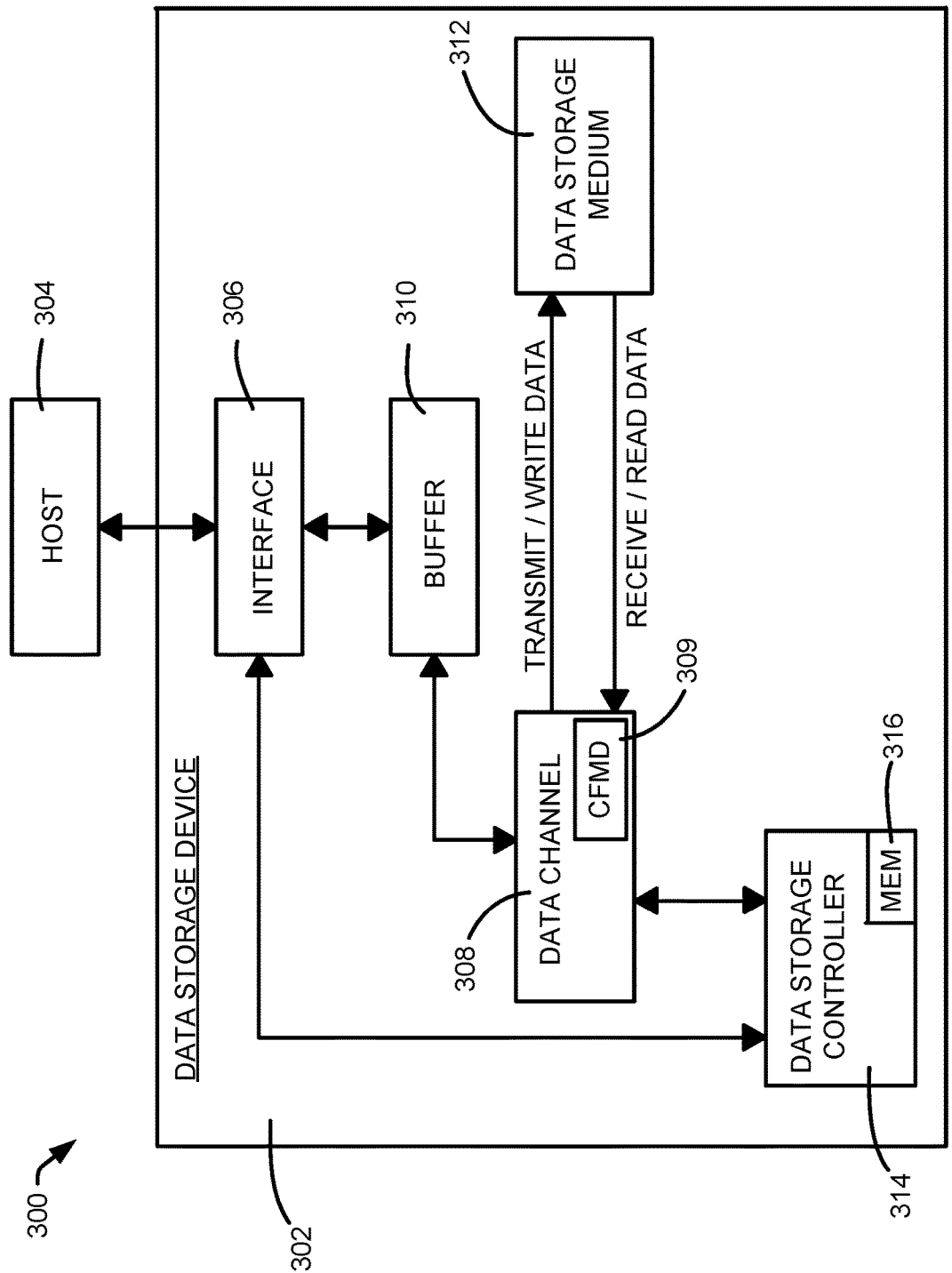
FIG. 3 is a diagram of a system implementing a multi-detector data channel utilizing different cost functions, in accordance with certain embodiments of the present disclosure.

Referring to FIG. 3, a diagram of a system implementing a multidetector data channel utilizing different cost functions, in accordance with certain embodiments of the present disclosure, is shown and generally designated 300. The system 300 may implement the methods, processes, and functions described herein; for example, the system 300 may implement the methods, processes, and functions as shown and discussed with respect to FIG. 1 or FIG. 2. The system 300 can include a data storage device ("DSD") 302 that has an interface 306 that connect to be removable from a host device 304, which can be a computer, a host bus adapter, a bus expander, a server, a telephone, a music player, another electronic device, or any combination thereof. The DSD 302 can communicate with the host device 304 via the hardware and firmware of the interface circuit 306, which may include a connector that allows the DSD 302 to be physically connected and physically disconnected from the host device 304.

The DSD 302 can include a data storage controller 314, which can include associated memory 316 that can store firmware, and a memory or buffer 310 that can temporarily store data during read and write operations. In some cases, the buffer 310 can be a volatile memory, such as dynamic random access memory (DRAM) or any other type of volatile memory. Further, the DSD 302 can include a data channel 308 which can transmit data to the data storage medium 312 by encoding data during write operations and retrieve data from the data storage medium 312 by decoding data during read operations. The data channel 308 may include cost function based multiple detector (CFMD) 309, such as described with respect to FIG. 1 and FIG. 2, or a combination thereof.

The data channel 308, CFMD 309, data storage controller 314, memory 316, buffer 310, and interface 306 may be implemented as one or more integrated circuits, discrete circuits, logic circuits, firmware, or any combination thereof. The CFMD 309 may be implemented to perform the data channel methods and processes discussed herein that allow a data channel to implement a cost function decision analyzer.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments can be made, and other embodiments not specifically described herein will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a data channel including:
        a first detector circuit configured to receive a signal representing a digital data signal and detect first decisions within the digital data signal based on a first cost function;
        a second detector circuit configured to also receive the signal representing the digital data signal and detect second decisions within the digital data signal based on a second cost function;
        a cost function analyzer circuit configured to selectively modify and send the first decisions as a data sequence based on a comparison of the first decisions and the second decisions; and
        a decoder circuit configured to receive the data sequence, decode the data sequence, and provide a data output of the data channel.

2. The apparatus of claim 1 comprising the data channel further including:
    a first equalizer circuit coupled to the first detector circuit and configured to apply a first equalization to the digital data signal prior to the first detector receiving the digital data signal; and
    a second equalizer circuit coupled to the second detector circuit and configured to apply a second equalization to the digital data signal prior to the second detector receiving the digital data signal.

3. The apparatus of claim 1 comprising the first cost function includes a pattern-dependent noise-predictive (PDNP) Soft Output Viterbi Algorithm (SOVA).

4. The apparatus of claim 3 comprising the second cost function includes a peak detection algorithm.

5. The apparatus of claim 1 comprising the cost function analyzer circuit further configured to:
   select the first decisions to be provided as the data sequence when the first decisions meet a minimum threshold; and
   when the first decisions do not meet the minimum threshold, not provide the first decisions as the data sequence.

6. The apparatus of claim 5 further comprising the minimum threshold is a minimum absolute value of a log likelihood ratio (LLR), and the first detector circuit further configured to determine an LLR value to correspond to each of the first decisions.

7. The apparatus of claim 6 comprising:
   the second detector circuit configured to output the second decisions;
   the cost function analyzer circuit further configured to:
      when the first decisions do not meet the minimum threshold, determine if the second decisions match the first decisions;
      when the second decisions match the first decisions, provide the first decisions as the data sequence; and
      when a second decision does not match a first decision, perform a different decision selection process to determine an unmatched decision.

8. The apparatus of claim 7 comprising the cost function analyzer circuit further configured to:
   when a second decision does not match a first decision, erase or modify any such first decision by assigning their LLR values to zero or another value; and
   provide the data sequence including an erased or modified decision to an error correcting code circuit.

9. The apparatus of claim 8 comprising the decoder circuit further configured to recover data corresponding to the erased or modified decision using an error correcting code algorithm.

10. The apparatus of claim 9 comprising the data channel further configured to:
    when decisions could not be recovered by the decoder:
       implement a new parameter set at the first detector circuit;
       determine, via the first detector, third decisions and LLRs corresponding to the third decisions based on the first cost function;
       add the third decisions that have corresponding LLRs that are greater than the minimum threshold to the data sequence to generate an updated data sequence, the added third decisions corresponding to the one or more erased decisions; and
       performing error correction at the decoder circuit for the updated data sequence.

11. A method comprising:
    receiving, at a data channel, an encoded digital data signal;
    determining, via a first detector, first decisions corresponding to data within the digital data signal based on a first cost function;
    determining, via a second detector, second decisions corresponding to the data within the digital data signal based on a second cost function distinct from the first cost function;
    determining a data sequence based on the first decisions and the second decisions;
    providing the data sequence to a decoder;
    generating, via the decoder, decoded data based on the decoder; and
    providing the decoded data as an output of the data channel.

12. The method of claim 11 comprising the first cost function is a Soft Output Viterbi Algorithm (SOVA) and the second cost function is a peak detection algorithm.

13. The method of claim 11 further comprising:
    determining first log-likelihood ratios (LLRs) corresponding to the first decisions;
    determining the data sequence based on the first decisions and the second decisions includes:
       performing a first decision selection process including adding first decisions corresponding to first LLRs that exceed a threshold to the data sequence while excluding first decisions that do not exceed the threshold from the data sequence; and
       performing a second decision selection process including comparing an excluded first decision to a corresponding location of a specific second decision, and adding the excluded first decision to the data sequence when the second decision matches the excluded first decision.

14. The method of claim 13 further comprising:
    when the second decision does not match the excluded first decision, performing third decision selection process that is distinct from the first decision selection process and the second decision selection process.

15. The method of claim 14 further comprising:
    erasing a decision location of the data sequence corresponding to a location where the first decision did not match the second decision; and
    performing error correction at the decoder to recover data corresponding to the erased decision location.

16. The method of claim 15 further comprising:
    when is a decision location that is an erased decision location could not be recovered by the decoder, performing a channel parameter update process including;
       implementing a new parameter set at the first detector;
       determining, via the first detector, third decisions and corresponding LLRs based on the first cost function;
       add a specific third decision that has a corresponding LLR that exceeds the threshold to the data sequence, the specific third decision corresponding to a location of the erased decision location; and
       repeating performing error correction at the decoder for the data sequence with the specific third decision.

17. A system comprising:
    a data channel including:
       a first detector configured to receive a signal, determine first decisions and first log likelihood ratios (LLRs) corresponding to digital samples of the signal based on a first cost function;
       a second detector configured to also receive the signal, determine second decisions corresponding to the digital samples of the signal based on a second cost function;
       a cost function analyzer configured to analyze the first decisions, the first LLRs, and the second decisions to determine a data sequence representing the signal; and
       a decoder configured to decode the data sequence and provide a data output of the data channel.

18. The system of claim 17 further comprising:
    an interface configured to allow the system to be removably coupled to a computing device;
    a data storage medium; and a data storage controller configured to utilize the data channel when performing read operations from the data storage medium.

19. The system of claim 17 comprising:

the data channel further configured to:
  determine the data sequence based on the first decisions and the second decisions, including:
    including the first decisions in the data sequence when the first LLRs exceed a threshold while excluding a selected first decision that does not exceed the threshold;
    comparing the selected first decision to a corresponding location of a second decision; and
    including the selected first decision in the data sequence when the second decision matches the selected first decision.

20. The system of claim 19 comprising the data channel further configured to determine when the selected first decision does not match the corresponding second decision, and determine a decision for the location of the data sequence corresponding to the selected first decision by performing a majority decision selection process from a multitude of detectors.

* * * * *